United States Patent
Ahlstedt et al.

(10) Patent No.: US 9,029,902 B2
(45) Date of Patent: May 12, 2015

(54) OPTOELECTRONIC SEMICONDUCTOR DEVICE COMPRISING A SEMICONDUCTOR CHIP, A CARRIER SUBSTRATE AND A FILM

(75) Inventors: Magnus Ahlstedt, Regensburg (DE); Johann Ramchen, Altdorf (DE)

(73) Assignee: OSRAM Opto Semiconductors GmbH (DE)

( * ) Notice: Subject to any disclaimer, the term of this patent is extended or adjusted under 35 U.S.C. 154(b) by 71 days.

(21) Appl. No.: 13/880,768

(22) PCT Filed: Sep. 27, 2011

(86) PCT No.: PCT/EP2011/066767
§ 371 (c)(1),
(2), (4) Date: Jun. 12, 2013

(87) PCT Pub. No.: WO2012/055661
PCT Pub. Date: May 3, 2012

(65) Prior Publication Data
US 2013/0256740 A1  Oct. 3, 2013

(30) Foreign Application Priority Data
Oct. 28, 2010  (DE) .......................... 10 2010 049 961

(51) Int. Cl.
*H01L 33/00* (2010.01)
*H01L 31/036* (2006.01)
*H01L 27/12* (2006.01)
*H01L 21/00* (2006.01)
*H01L 33/62* (2010.01)

(52) U.S. Cl.
CPC ......... *H01L 33/62* (2013.01); *H01L 2924/0002* (2013.01)

(58) Field of Classification Search
CPC ............ H01L 33/62; H01L 2924/0002; H01L 2924/00
USPC .................. 257/99, 88, 433, 98, 59, 347, 432; 438/33
See application file for complete search history.

(56) References Cited

U.S. PATENT DOCUMENTS

| | | | |
|---|---|---|---|
| 2006/0011928 A1* | 1/2006 | Sorg et al. ........................ | 257/81 |
| 2006/0208271 A1* | 9/2006 | Kim et al. ....................... | 257/100 |
| 2009/0101897 A1* | 4/2009 | Murphy et al. ................. | 257/48 |
| 2009/0108281 A1* | 4/2009 | Keller et al. .................... | 257/98 |
| 2009/0127573 A1* | 5/2009 | Guenther et al. ............... | 257/98 |
| 2009/0272987 A1* | 11/2009 | Wang .............................. | 257/88 |
| 2009/0278139 A1 | 11/2009 | Fjelstad | |
| 2010/0117103 A1* | 5/2010 | Marfeld et al. ................. | 257/91 |
| 2010/0123498 A1* | 5/2010 | Bae et al. ....................... | 327/158 |

FOREIGN PATENT DOCUMENTS

| | | | |
|---|---|---|---|
| DE | 10 2006 015 115 A1 | 10/2007 | |
| WO | 03/030247 A2 | 4/2003 | |
| WO | 2004/004017 A2 | 1/2004 | |

\* cited by examiner

*Primary Examiner* — Long K Tran
*Assistant Examiner* — Dzung Tran
(74) *Attorney, Agent, or Firm* — DLA Piper LLP (US)

(57) ABSTRACT

A semiconductor device includes a radiation-emitting semiconductor chip, a carrier substrate and a film. The carrier substrate has electrically conductive contact tracks on a top side. The film is arranged on a radiation exit side of the chip, the radiation exit side being remote from the carrier substrate, and on the top side of the carrier substrate and has electrically conductive first conductor tracks. The film has perforations arranged such that the semiconductor chip can be electrically contact-connected to the first contact track of the carrier substrate via the first conductor track of the film.

14 Claims, 7 Drawing Sheets

OPTOELECTRONIC SEMICONDUCTOR DEVICE COMPRISING A SEMICONDUCTOR CHIP, A CARRIER SUBSTRATE AND A FILM

TECHNICAL FIELD

This disclosure relates to a semiconductor device comprising a semiconductor chip, a carrier substrate and a film as well as a method of producing such a semiconductor device.

BACKGROUND

Conventional optoelectronic devices are usually arranged on a carrier substrate for the purpose of electrical contact-connection and mechanical stabilization. In that case, there is the possibility of individual mounting of such devices on, for example, a board or a circuit board. By way of example, a gold wire is used for the electrical contact-connection of the devices, the gold wire being led from a contact area of the device to a contact track of the carrier substrate. Contact-connections by a bonding wire, for example, a gold wire, have the disadvantage, however, that such devices are embodied with a tall height.

CPHF technology (CPHF: Compact Planar High Flux) is employed as an alternative electrical contact-connection technology. Such a contact-connection has conductor tracks arranged on an electrically insulating material, wherein the conductor tracks are led from a contact area of the device to a contact track of the carrier substrate. In that case, the conductor tracks can be applied to the electrically insulating material by, for example, a plating process, a sputtering process, a shadow mask and/or a lift-off process such that an electrically conductive contact is made possible. In the case of CPHF contact-connection technology, however, contaminations can disadvantageously occur in the regions of the contact areas of the device and the conductor tracks of the carrier substrate.

The above-described possibilities for the electrical contact-connection of optoelectronic devices additionally have the disadvantage that the devices can be combined only with the carrier substrates provided for the respective contact-connecting technology.

It could therefore be helpful to provide a semiconductor device distinguished by a flat design, a reduced risk with regard to contamination and at the same time by a flexible electrical interconnection of individual device components. It could also be helpful to provide a flexible production method for such a device.

SUMMARY

We provide an optoelectronic semiconductor device including a semiconductor chip, a carrier substrate and a film, wherein the semiconductor chip has an active layer that generates radiation, the carrier substrate has a first electrically conductive contact track and a second electrically conductive contact track on a top side, the semiconductor chip is arranged on the top side of the carrier substrate, the film is arranged at least in regions on a radiation exit side of the semiconductor chip, the radiation exit side being remote from the carrier substrate and on the top side of the carrier substrate, the film has at least one electrically conductive first conductor track at least in regions on a top side remote from the carrier substrate, and the film has at least one first perforation and at least one second perforation arranged such that the semiconductor chip can be electrically contact-connected to the first contact track of the carrier substrate via the first conductor track of the film.

We also provide a method of producing the optoelectronic device including a semi-conductor chip, a carrier substrate and a film, including providing the carrier substrate which has a first electrically conductive contact track and a second electrically conductive contact track on a top side, arranging the semiconductor chip on the top side of the carrier substrate, laminating the film at selected regions on a radiation exit side of the semiconductor chip, the radiation exit side being remote from the carrier substrate, and on the top side of the carrier substrate, wherein the film has at least one electrically conductive first conductor track, at least one first perforation and at least one second perforation at least in regions on a top side remote from the carrier substrate, and electrically contact-connecting the semiconductor chip to at least the first contact track of the carrier substrate via the first conductor track of the film by the perforations.

We further provide an optoelectronic semiconductor device including a semiconductor chip, a carrier substrate and a film, wherein the semiconductor chip has an active layer that generates radiation, the carrier substrate has a first electrically conductive contact track and a second electrically conductive contact track on a top side, the semiconductor chip is arranged on the top side of the carrier substrate, the film is arranged at least in regions on a radiation exit side of the semiconductor chip, the radiation exit side being remote from the carrier substrate and on the top side of the carrier substrate, the film has at least one electrically conductive first conductor track at least in regions on a top side remote from the carrier substrate, the film has at least one first perforation and at least one second perforation arranged such that the semiconductor chip can be electrically contact-connected to the first contact track of the carrier substrate via the first conductor track of the film, the perforations perforate the first conductor track in places and the perforations completely penetrate through the first conductor track, an electrical contact-connection between the semiconductor chip and the first conductor track is formed by contact drops that are respectively introduced into a respective perforation of the film, and a material of the contact drop differs from a material of the first conductor track.

DETAILED DESCRIPTION

Figure 1:
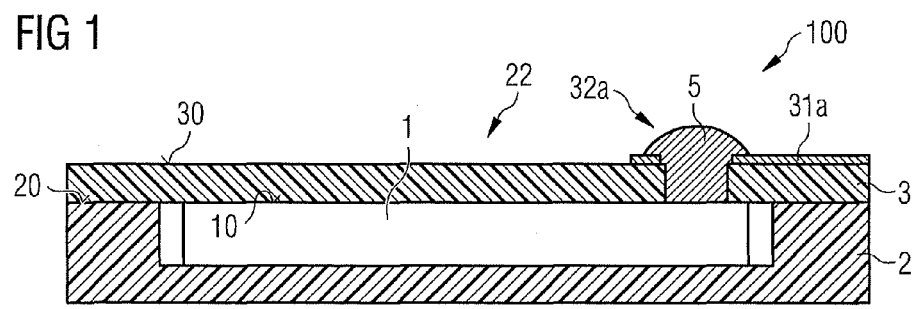
FIG. 1 shows a schematic cross section of an example of an optoelectronic semiconductor device.

Our optoelectronic semiconductor device may comprise a semiconductor chip, a carrier substrate and a film, wherein the semiconductor chip has an active layer provided to generate radiation. The carrier substrate has a first electrically conductive contact track and a second electrically conductive contact track on a top side. The semiconductor chip is arranged on the top side of the carrier substrate. The film also referred to as "foil" is arranged at least in regions on a radiation exit side of the semiconductor chip, the radiation exit side being remote from the carrier substrate, and on the top side of the carrier substrate. The film has at least one electrically conductive first conductor track at least in regions on a top side remote from the carrier substrate. The film has at least one first perforation and one second perforation arranged such that the semiconductor chip can be electrically contact-connected to the first contact track of the carrier substrate via the first conductor track of the film.

An optoelectronic device is, in particular, a device which makes it possible to convert electrical energies into radiation emission or vice versa. By way of example, the optoelectronic device is a radiation-emitting device.

The electrical contact-connection of the semiconductor chip is thus effected via the first conductor track arranged on that side of the film remote from the chip. As a result, a conventionally used bonding wire is not necessary as a result of which the height of the device is not dependent on the bonding wire and can thus be reduced. Flat devices are thus advantageously made possible.

With the film surrounding the semiconductor chip at least in regions, the semiconductor chip can advantageously be protected against mechanical environmental influences. As a result, the risk of contamination of the contact areas of the chip or of the contact tracks of the carrier substrate can advantageously be reduced.

In addition, a combination of the carrier substrate with contact tracks arranged thereon and the film with conductor tracks and perforations arranged thereon enables a flexible interconnection of the chips with other semiconductor components and/or the carrier substrate. By way of example, resistors, sensors, silicon chip drivers or ESD diodes can be employed as other semiconductor components.

The conductor tracks on the film can be structured in accordance with the envisaged application. As a result, the film and the electrical guidance on the film can advantageously be structured such that a flexible combination of the device components is made possible.

The film may be at least partly transparent or transmissive to the radiation emitted by the semiconductor chip. Preferably, the film is transmissive to the radiation emitted by the semiconductor chip to the extent of 90%, particularly preferably to the extent of 99%.

Alternatively, the film can be non-transmissive to the radiation emitted by the semiconductor chip. In this case, in the arrangement region of the film, the radiation emitted by the semiconductor chip is shaded towards the outside.

The semiconductor chip, in particular the active layer, may contain a III/V semi-conductor material, for instance a material made from the material systems $In_xGa_yAl_{1-x-y}P$, $In_xGa_yAl_{1-x-y}N$ or $In_xGa_yAl_{1-x-y}As$, in each case where $0 \leq x, y \leq 1$ and $x+y \leq 1$. III/V semiconductor materials are particularly suitable to generate radiation in the ultraviolet ($In_xGa_yAl_{1-x-y}N$), through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range.

The semiconductor chip is preferably an LED. Preferably, the semiconductor chip is a thin-film LED. A thin-film LED is considered to be an LED during whose production the growth substrate, onto which a semiconductor layer sequence of the chip was grown epitaxially, for example, has been stripped away.

The active layer of the chip preferably has a pn junction, a double heterostructure, a single quantum well (SQW) structure or a multi quantum well (MQW) structure to generate radiation. In this case, the designation quantum well structure does not exhibit any significance with regard to the dimensionality of the quantization. It therefore encompasses, inter alia, quantum wells, quantum wires and quantum dots and any combination of such structures.

The semiconductor chip may have, for example, an electrical contact-connection on two sides. In this case, the semiconductor chip has a first contact area on the side facing the carrier substrate and a second contact area on the side remote from the carrier substrate. In this case, for the electrical contact-connection of the chip it suffices if only one first conductor track is arranged on the film. The second contact-connection of the chip is effected from the chip underside via a contact track of the carrier substrate, onto which the semiconductor chip, by its underside, can be directly fixed and electrically contact-connected. The contact tracks of the carrier substrate are electrically insulated from one another, for example, by spacing, an electrically insulating layer or the film in electrically insulating fashion.

Alternatively, the semiconductor chip can have an electrical contact-connection on one side. In this case, both contact areas of the chip are arranged on the side remote from the carrier substrate. Consequently, no direct electrical linking takes place between the carrier substrate and the chip. In this case, the electrical contact-connection is respectively effected at the radiation exit side of the chip. At least two conductor tracks are arranged on the film, and are electrically insulated from one another by spacing, for example. A respective contact area of the chip is electrically conductively connected to a contact track of the carrier substrate by a conductor track.

The film may be fixed by an adhesive layer on the semiconductor chip and the carrier substrate. The adhesive layer is preferably arranged on a film underside, that is to say directly between chip/carrier substrate and film. Preferably, the adhesive layer is made as thin as possible to avoid possible contamination of the contact areas of the chip and the contact tracks of the carrier substrate.

The adhesive layer has a thickness of 5 µm to 10 µm.

The perforations of the film lead completely through the film. Therefore, holes are formed in the region of the perforations of the film. For the electrical contact-connection of the semiconductor chip, a contact material, which is electrically conductive, is in each case introduced in the region of the perforations.

The perforations in the film may have a diameter of at least 100 µm. By virtue of the comparatively large perforations in the film, the contact areas at the semiconductor chip and the contact tracks on the carrier substrate are advantageously protected against possible contaminations.

The perforations may perforate the first conductor track at least in places. Preferably, two perforations are formed in the first conductor track. The first conductor track therefore has per se in turn perforations formed in the region of the perforations of the film. The perforations of the film are bordered in a ring-shaped fashion with the material of the first conductor track.

A contact material is in each case introduced into the perforations of the film and into the perforations of the first conductor track, thereby ensuring reliable electrical contact-connection from a contact area of the semiconductor chip to a contact track of the carrier substrate. In this case, the first perforation of the film and the first perforation of the conductor track are preferably arranged in the region of the contact area of the semiconductor chip. The second perforation of the film and the second perforation of the first conductor track are preferably arranged in a region of the first contact track of the carrier substrate. In this case, the first conductor track leads from the first perforation of the film to the second perforation of the film.

If the chip is a one-sided semiconductor chip, then a corresponding electrical contact-connection takes place at the second contact area of the semiconductor chip.

The film may be a multilayer film having a plurality of electrically insulating film layers and further electrically conductive conductor tracks arranged therebetween. The film is thus composed of multilayered film layers, which are preferably transparent, wherein structured, preferably metallic conductor tracks for realization of a multilayered interconnection plane are formed in integrated fashion in the film. In this case, the individual conductor track layers can subsequently be interconnected with one another, whereby a universal interconnection is made possible.

The diameter of the perforations may decrease in a vertical direction from the top side of the film in a direction of the carrier substrate. In the case of a multilayer film, the layers facing the semiconductor chip accordingly have a smaller diameter of the perforations than layers further away from the semiconductor chip. This makes it possible to ensure that all layers of the multilayer film are electrically conductively connected by the contact material.

The carrier substrate may have a cutout in which the chip is arranged. As a result, the chip can advantageously be protected against mechanical environmental influences.

The height of the cutout may correspond at least to the height of the semiconductor chip. The semiconductor chip is completely enclosed laterally by the carrier substrate. As a result, the best possible protection against mechanical environmental influences can be ensured. Moreover, the film can thus be arranged in planar fashion onto the top side of the carrier substrate and the radiation exit side of the semiconductor chip.

The film has a further perforation in the region of a radiation exit area of the semiconductor chip. The radiation exit area of the chip is thus free of film material. In this case, the radiation exit area need not necessarily correspond to the radiation exit side of the semiconductor chip. By way of example, the radiation exit area covers only a partial region of the radiation exit side. The radiation exit area is, in particular, that area of the semiconductor chip from which the greatest possible radiation emission emerges from the chip.

A converter material may be applied in the further perforation on the radiation exit area. A converter material comprises, for example, a potting material with at least one conversion element embedded therein. In this case, the conversion element is preferably uniformly distributed in the potting material. In this case, the conversion element is suitable to at least partly convert the radiation emitted by the semiconductor chip into radiation having a different wavelength such that the device emits mixed radiation composed of converted radiation and radiation emitted by the semiconductor chip. By way of example, a device that emits white, green or red radiation by conversion is thus made possible.

The carrier substrate is, for example, a carbon fiber substrate, a fiberglass substrate, a ceramic substrate, an epoxy substrate or a circuit board, for example, a PCB (printed circuit board).

The film preferably contains epoxide, silicone or polycarbonate. By way of example, highly reflective films such as, for example, aluminium-vapour-deposited films, $TiO_2$-filled films or KAPTON films are used as non-transparent films.

In particular a metal or a metal alloy containing, for example, copper, silver, aluminium and/or gold is used as material of the conductor tracks and contact tracks.

The contact material is, for example, a contact drop of an electrically conductive material such as, for example, a soldering paste composed of Sn or an electrically conductive adhesive. In this case, the contact material is introduced into the perforations of the film by a dispensing process, a screen printing process or a jet process.

The perforations in the film are introduced, for example, by a stamping or laser process.

The converter material is introduced in the further perforation of the film, for example, by a dispensing or layer attach process.

We also provide a method of producing an optoelectronic device comprising a semiconductor chip, a carrier substrate and a film, wherein the following method steps are employed:
providing the carrier substrate having a first electrically conductive contact track and a second electrically conductive contact track on a top side,
arranging the semiconductor chip on the top side of the carrier substrate,
laminating the film at least in regions on a radiation exit side of the semiconductor chip, the radiation exit side being remote from the carrier substrate, and on the top side of the carrier substrate, wherein the film has at least one electrically conductive first conductor track, a first perforation and a second perforation at least in regions on a top side remote from the carrier substrate, and
electrically contact-connecting the semiconductor chip to at least the first contact track of the carrier substrate via the first conductor track of the film by the perforations.

Advantageous developments of the method emerge analogously to the advantageous developments of the device, and vice-versa.

On account of the electrical contact-connection of the chip via the film, in particular a flexible interconnection of the chip with, for example, other semiconductor components arranged on the carrier substrate such as, for example, ESD diodes, resistors, sensors and/or silicon chip drivers, is made possible.

In this case, the electrical contact-connection of the semiconductor chip can be on two sides. In this case, the semiconductor chip is fixed by a contact area on the underside directly on the second contact track of the carrier and electrically conductively connected to the contact track. The chip contact area on the top side is led by the perforations via the first conductor track of the film to the first contact track of the carrier substrate. In this case, an electrically conductive contact material is in each case arranged in the perforations, and electrically conductively connects the chip contact area on the top side to the first conductor track of the film. A further contact material is arranged in the second perforation, and electrically conductively connects the first conductor track to the first contact track of the carrier substrate. The contact materials are electrically conductively connected to the first conductor track.

If the semiconductor chip is a semiconductor chip which can be contact-connected on one side, the contact areas of the chip are arranged and electrically contact-connected on the top side.

The perforations may be formed in the film by stamping or laser action. Preferably, the conductor tracks are first applied to the surface of the film, for example, by a dispensing process, followed by forming the perforations through the film and in part through the first conductor track.

The electrical contact-connection may be formed by contact drops respectively introduced into a respective perforation of the film. By way of example, the contact drops are introduced into the perforations by a dispensing process, a screen printing process or a jet process.

A plurality of optoelectronic devices may be produced in a common method. In this case, the plurality of semiconductor chips are arranged on a common carrier substrate. The film is subsequently laminated in one piece. The devices can subsequently be singulated.

A reflector layer can be applied on the common carrier substrate before the semiconductor chips are applied, the reflector layer designed to reflect the radiation emitted by the semiconductor chips in the direction towards the radiation exit side.

The conductor track at the top side of the film, the top side being remote from the carrier substrate, may be produced from a different material from the contact drop. The contact material is therefore different from the material of the conductor track. The materials of the contact track and of the conductor track can likewise be different from one another.

The perforations in the conductor track may be free of a material of the conductor track. No material of the conductor tracks or of the contact tracks is then fitted particularly at walls of the perforations.

One of the perforations may be situated above the semiconductor chip, as seen in plan view, and one of the perforations may be situated alongside the semiconductor chip in a lateral direction. Particularly by one of the contact drops and the perforation above the semiconductor chip, the latter is contact-connected to the conductor track. By the perforation alongside the semiconductor chip and one of the contact drops, in particular the conductor track and the contact track are electrically connected to one another.

Further features, advantages, developments and expediences of the device and the method for producing the device will become apparent from the examples explained below in conjunction with FIGS. 1 to 6.

Identical or identically acting constituent parts are in each case provided with the same reference symbols. The constituent parts illustrated and also the size relationships of the constituent parts among one another should not be regarded as true to scale.

FIG. 1 shows a cross section of an optoelectronic semiconductor device 100 comprising a semiconductor chip 1, a carrier substrate 2 and a film 3.

The carrier substrate 2 has a cutout 22 in which the semiconductor chip 1 is arranged. Preferably, the size of the cutout 22 is adapted to the size of the semiconductor chip 1. By way of example, the base area of the cutout 22 is such that the semiconductor chip 1 is arranged completely in the cutout 22. The height of the cutout 22 is preferably greater than or equal to the height of the semiconductor chip 1. In the example in FIG. 1, the height of the cutout 22 corresponds to the height of the semiconductor chip 1. Accordingly, the semiconductor chip 1 does not project beyond the carrier substrate 2 in a vertical direction. This advantageously enables protection of the semiconductor chip 1 against mechanical damage by the carrier substrate 2.

The carrier substrate 2 has, on a top side 20, a first electrically conductive contact track and a second electrically conductive contact track for the electrical contact-connection of the semiconductor chip 1 (not illustrated). By way of example, the first electrically conductive contact track is arranged in the cutout 22 and the second electrically conductive contact track is arranged outside the cutout 22. Alternatively, both contact tracks of the carrier substrate 2 can be arranged outside the cutout 22. The arrangement of the contact tracks on the carrier substrate 2 is dependent, in particular, on the envisaged electrical contact-connection of the semiconductor chip 1, in particular whether the semiconductor chip 1 has an electrical contact-connection on one side or on two sides.

The carrier substrate 2 is, for example, a carbon fiber substrate, an epoxy substrate, a ceramic substrate, a circuit board (PCB: printed circuit board) or a fiberglass substrate.

The semiconductor chip 1 is preferably a light-emitting diode (LED). Preferably, the semiconductor chip is a thin-film chip. The semiconductor chip 1 is suitable, in particular, to generate radiation during operation on account of an active layer arranged in the chip. Radiation generated in the semiconductor chip 1 during operation is coupled out at a radiation exit side via a radiation exit area. In this case, preferably the highest proportion of the radiation generated in the chip is coupled out through the radiation exit area at the radiation exit side 10 of the semiconductor chip 1.

The semiconductor chip 1, by a side opposite the radiation exit side 10, is fixed on the carrier 2. By way of example, the semiconductor chip 1 is mechanically connected to the carrier substrate 1 by an adhesive layer or a solder layer.

If the semiconductor chip 1 has a contact-connection on two sides, that is to say a contact-connection by a contact area at the radiation exit side 10 and a second contact area at the side opposite the radiation exit side 10, the semiconductor chip 1 is mechanically and electrically connected to the carrier substrate 2 by an electrically conductive layer. By way of example, for this purpose, the carrier substrate 2 has in the cutout 22 the first electrically conductive contact track on which the semiconductor chip 1 is arranged and electrically conductively connected thereto.

Alternatively, the semiconductor chip 1 can have an electrical contact-connection on one side. In this case, the first contact area and the second contact area of the semiconductor chip 1 are arranged on the same side of the chip, for example, on the side remote from the carrier substrate 2. By that side of the semiconductor chip 1 remote from the radiation exit side 10, the semiconductor chip is in this case not electrically, but only mechanically connected to the carrier substrate 2.

A film 3 also referred to as "foil" is arranged on the radiation exit side 10 of the semiconductor chip 1 and on the top side 20 of the carrier substrate 2. The film 3 is electrically insulating. By way of example, the film comprises epoxide, silicone or PC. Alternatively, the film can be a glass plate. The film 3 preferably has transparent properties for the radiation emitted by the semiconductor chip 1. Preferably, the film is radiation-transmissive in this spectral range to the extent of 80%, preferably to the extent of 90%, particularly preferably to the extent of 99%.

Alternatively, the film 3 can have radiation-non-transmissive properties. By way of example, the film 3 is a highly reflective film such as, for example, an aluminium-vapour-deposited film, a $TiO_2$-filled film or a KAPTON film.

The film is preferably arranged, apart from perforations 32a introduced in the film, completely on the radiation exit side 10 and the top side 20 of the carrier substrate 2. The film 3 thus advantageously affords additional protection against mechanical environmental influences of the semiconductor chip 1.

At least one electrically conductive first conductor track 31a is applied in regions on a top side 30 of the film, the top side being remote from the carrier substrate 2. The electrical conductor track 31a serves for the electrical contact-connection of the semiconductor chip 1. The number of conductor tracks applied on the top side 30 depends on the electrical contact-connection of the semiconductor chip 1, that is to say whether the semiconductor chip 1 has a contact-connection on one side or on two sides.

The contact tracks of the carrier 2 and the conductor tracks of the film 3 preferably comprise copper, aluminium or gold.

The film 3 has at least one first perforation 32a and at least one second perforation 32b. In this case, the perforations of the film should be understood as cutouts in the film which completely perforate the film. Consequently, no film material is arranged in the region of the perforations.

Perforations in the film 3 are arranged such that the semiconductor chip 1 can be electrically contact-connected. In particular, the perforations are arranged such that the semiconductor chip can be electrically conductively connected to the first contact track of the carrier substrate via the first conductor track 31a of the film 3. By way of example, the first perforation 32a is arranged in the region of a first contact area of the semiconductor chip 1. An electrically conductive material, for example, a contact drop 5, is arranged in the first perforation 32a. In this case, the contact drop 5 completely fills the perforation of the film. In particular, the height of the contact drop 5 is greater than the height of the perforation of the film 3.

The first perforation 32a of the film 3 perforates the first conductor track 31a in regions. The first perforation 32a accordingly leads through the film and through the first conductor track to the first contact area of the chip 1. In this case, the first conductor track 31a encloses the perforation 32a on the top side in a ring-shaped manner. The contact drop 5 is arranged in regions on the conductor track 31a, in particular in the edge region of the perforation.

The second perforation is in accordance with the first perforation, wherein the second perforation is arranged in regions above a contact track of the carrier substrate 2. A contact drop is likewise arranged in the second perforation, the contact drop enabling an electrical contact of the first conductor track of the film with the first contact track of the carrier substrate. The second perforation and the second contact drop are not illustrated in FIG. 1, for the sake of clarity.

If the semiconductor chip 1 is a one-sided semiconductor chip, wherein both contact areas are arranged on the radiation exit side 10, the second contact area of the semiconductor chip is correspondingly electrically conductively connected to a second contact track of the carrier substrate by two perforations and contact drops arranged therein and also by a second conductor track on the film 3.

The contact drop 5 is, for example, an Sn soldering paste or an electrically conductive adhesive. By way of example, the contact drop 5 or the contact drops 5 is or are introduced into the perforations by a dispensing process, a screen printing process or a jet process.

The first and second perforations in the film 3 are formed, for example, by a laser or stamping process.

The film 3 is fixed by an adhesive layer on the semiconductor chip 1 and the carrier substrate 2. In this case, the adhesive layer has a thickness of 5 μm to 10 μm. On account of the thinness of the adhesive layer, preferably on the film underside, it is possible to reduce the risk of contamination of the contact areas of the chip 1 and the contact tracks of the carrier substrate 2 in the region of the perforations. A further reduction of a risk of contamination can be ensured by perforations having a diameter of greater than 100 μm.

A combination of the film with conductor tracks arranged thereon and perforations and with the carrier substrate with contact tracks arranged thereon makes it possible to obtain a flexible interconnection of the semiconductor chip with, for example, other semiconductor components such as, for example, ESD diodes, resistors, sensors or silicon chip drivers. Moreover, a flat semiconductor device is ensured on account of the electrical contact-connection. In this case, the conductor tracks can be applied on the film by a dispensing process, for example, depending on the corresponding and envisaged requirement such that the film can be used flexibly.

Figure 2A:
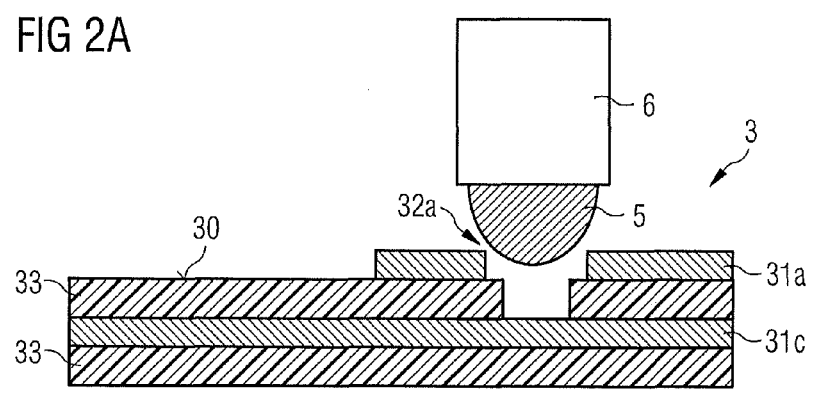
FIGS. 2A, 2B and 3 in each case show a schematic cross section of an example of a film for our device.
Figure 2B:
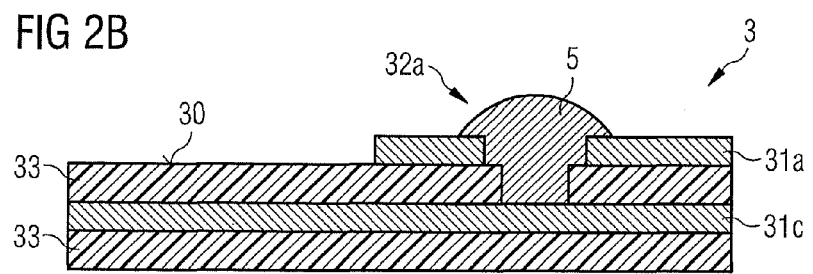

FIGS. 2A and 2B illustrate introduction of the contact drop 5 into the perforation of the electrically insulating film 3. In this case, the electrically insulating film is, for example, an electrically conductive paste introduced into the perforation 32a of the film 3 by an inkjet process. Such a film with introduced contact drops 5 can be used, for example, for a device in the example in FIG. 1.

The film 3 in FIGS. 2A and 2B is a multilayer film composed of a plurality of electrically insulating film layers 33 and further electrically conductive conductor tracks 31c arranged therebetween. The electrically conductive layers are copper layers, for example. In this case, the contact drop 5 electrically connects a copper layer 31c arranged between the film layers 33 to the first conductor track 31a on the top side 30 of the film 3.

In this case, the perforation 32a extends through the first conductor track 31a and the topmost film layer 33. In this case, the diameter of the perforation decreases in a vertical direction from the top side 30 of the film 3 in the direction of the carrier substrate 2. In particular, the perforation of the first conductor track 31a is larger than the perforation of the bottommost film layer 33 in terms of the lateral extent. It can thus be ensured that all the layers of the film are connected by one contact drop. By way of example, the diameter decreases in a stepped manner from layer to layer.

Figure 3:
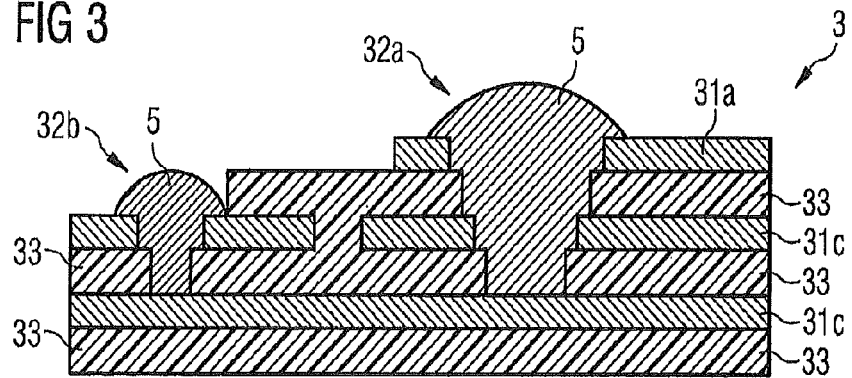

FIG. 3 shows a further example of a film 3 with a contact drop 5 introduced in the perforations 32a, 32b. Such a film can be used, for example, in the device according to the example in FIG. 1.

The film of FIG. 3 is composed of a further plurality of film layers 33 and electrically conductive conductor tracks 31c in comparison with the film from FIG. 2B. Moreover, in a further difference, the multilayer film 3 has two perforations 32a, 32b, into each of which a contact drop 5 is introduced. In this case, the diameters of the perforations 32a, 32b in the individual film layers 33, 31c, 31a decrease from the top side 40 of the film toward the underside.

For the rest, the example in FIG. 3 corresponds to the example in FIG. 2B.

FIGS. 4A to 4I illustrate a device in the production process, wherein the individual figures illustrate individual method steps. The devices are illustrated in perspective view in this case.

Figure 4A:
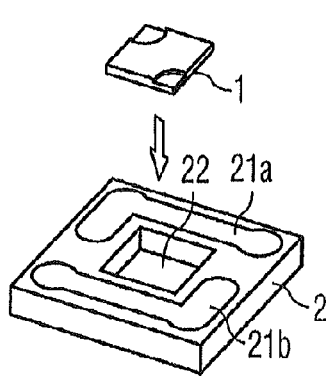
FIGS. 4A to 4I in each case show schematic views of an example of our device in the production method.

FIG. 4A shows a carrier 2 having a first contact track 21a and a second contact track 21b on a top side. A cutout 22 is centrally located, the size of the cutout depending on a semiconductor chip 1 to be used. The carrier substrate 2 is electrically insulating. The contact tracks of the carrier substrate 2 are arranged outside the cutout 22. The semiconductor chip 1 is introduced into the cutout 22 such that the carrier substrate 2 completely surrounds the semiconductor chip 1 laterally. In particular, the height of the cutout 22 is preferably approximately equal to the height of the semiconductor chip 1.

In this example, the semiconductor chip 1 is a chip which can be contact-connected on one side and which has a first and second contact area on the radiation exit side remote from the carrier 2.

Figure 4B:
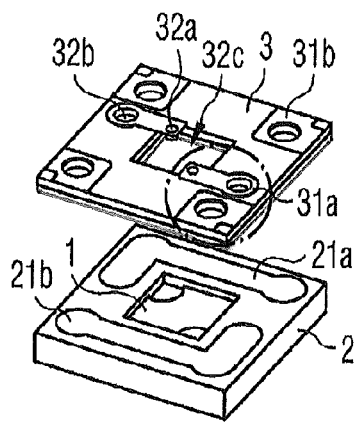

After the semiconductor chip 1 has been arranged in the cutout 22 of the carrier substrate 2, a film 3 is applied to the top side of the carrier substrate 2 and the semiconductor chip 1, as illustrated in FIG. 4B. The film 3 has first conductor tracks 31a and second conductor tracks 31b on a top side 30. The first conductor tracks 31a each have two perforations that likewise lead through the film 3. In this case, the material of the first conductor track 31a surrounds the perforations in a ring-shaped manner. The perforations are arranged, in particular, at two opposite ends of the first conductor track 31a.

The second conductor tracks 31b have corresponding perforations leading through the film 3. The second conductor tracks 31b are in each case arranged at corner edges of the film 3 and thus of the device. The second conductor tracks 31b, for example, interconnect the semiconductor chip 1 with other semiconductor components. On account of the corner-like arrangement of the second conductor tracks 31b, a flexible interconnection of the semiconductor chip 1 with other components is possible.

In the region of a radiation exit area of the semiconductor chip 1, a further perforation is formed in the film 3. In this case, the further perforation is of a size such that the radiation exit area of the chip 1 is completely free of film material. In this case, the first conductor tracks 31a of the film 3 can project into the further perforation. The first conductor tracks 31a are arranged, in particular, at opposite corners of the further perforation.

Figure 4C:
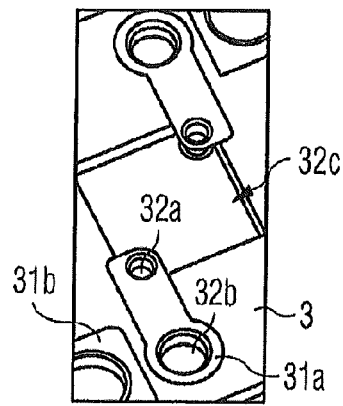

An enlarged view of the excerpt represented by a circle in FIG. 4B is illustrated in FIG. 4C. The first conductor track 31a projects into the further perforation 32c, wherein the first perforation 32a is in this case arranged in the further perforation 32c. In this case, the first perforation 32a and the further perforation 32c are spatially separated from one another by film material and first conductive structure 31a applied thereon.

Figure 4D:
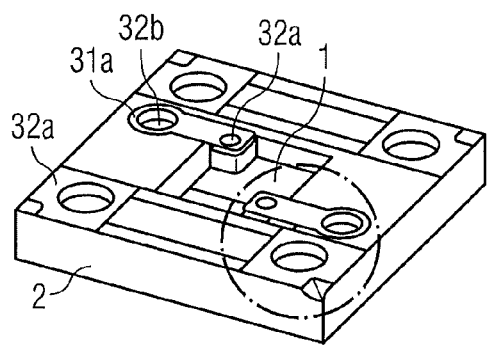

In FIG. 4D, the film 3 with conductor track structures applied thereon and perforations is applied on the top side of the carrier substrate and the semiconductor chip 1. In this case, the further perforation is arranged above the radiation exit area of the semiconductor chip 1. The first perforation 32a is arranged above the first contact area of the semiconductor chip 1, wherein the second perforation 32b is arranged above a contact track of the carrier substrate. The first perforation 32a and the second perforation 32b connect to the first conductive structure 31a.

Figure 4E:
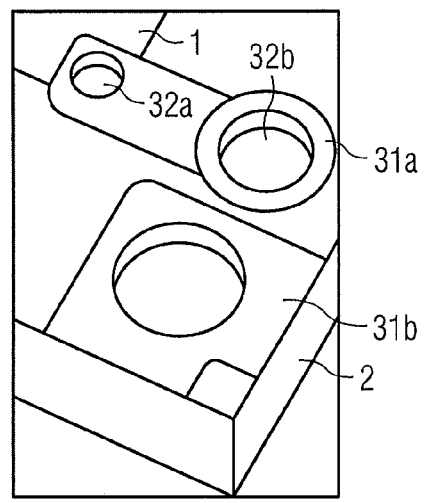

FIG. 4E illustrates the first conductive structure of the device from FIG. 4D in greater detail, in particular the excerpt represented by a circle in FIG. 4D. In this case, the first conductive structure 31a leads on the film from the first contact area of the semiconductor chip 1 to the first contact track of the carrier substrate 2. The first perforation 32a and the second perforation 32b are arranged in the first conductive structure 31a, wherein the edges of the perforations are surrounded by the first conductive structure 31a. The first contact area of the semiconductor chip 1 and the first contact track of the carrier substrate 2 can be electrically connected via the first conductor track 31a by the perforations 32a, 32b. The second conductor tracks 31b can be used for the electrical interconnection of the semiconductor chip 1 with further electrical devices or components.

Figure 4F:
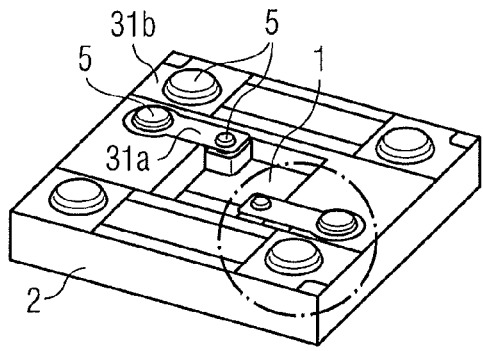

In FIG. 4F, a respective contact drop 5 is subsequently introduced into the individual perforations. The contact drops 5 in each case project beyond the height of the perforations such that the contact drops 5 project from the perforations such that they are in direct mechanical and electrical contact at least in part on the conductor tracks of the film. The contact drops 5 preferably fill the perforations completely in each case such that an electrical contact, for example, from the contact areas of the semiconductor chip to the first electrical conductor track of the film via the contact drop introduced there can be obtained. The further perforation above the radiation exit area remains free of contact drop material in this case.

Figure 4G:
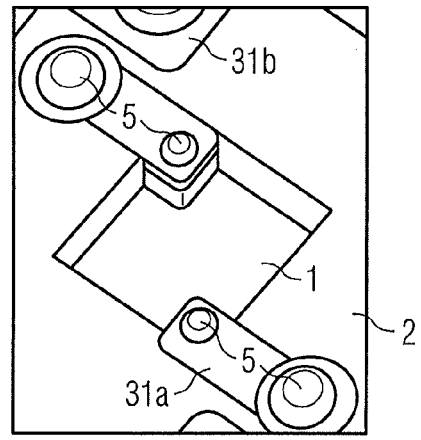

The excerpt represented by a circle in FIG. 4F is shown in an enlarged view in FIG. 4G. A respective contact drop 5 is introduced in the perforations of the first conductor track 31a, wherein the contact drops 5 are arranged above the contact areas of the semiconductor chip 1 in a vertical direction. The contact drops accordingly project in these regions through the perforations as far as the contact areas such that an electrically conductive connection can be ensured.

Figure 4H:
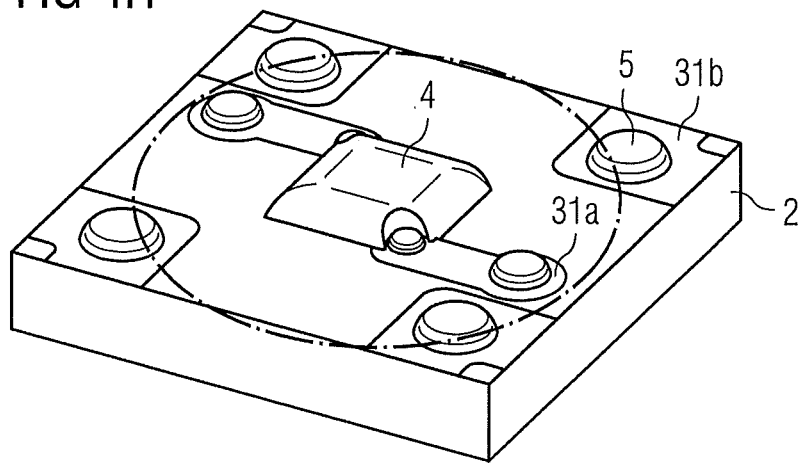

In FIG. 4H, finally, a converter material 4 is applied in the further perforation arranged above the radiation exit area of the semiconductor chip 1. The converter material can be applied, for example, by a dispensing process or layer attach process. A conversion element which at least partly converts the radiation emitted by the semiconductor chip into radiation having a different wavelength is preferably arranged in the converter material. Thus, by way of example, a device that emits white radiation can be realized.

Figure 4I:
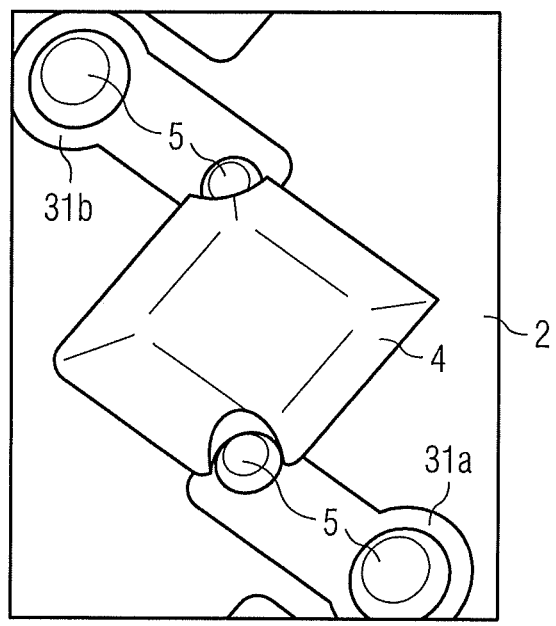

The excerpt from the device that is represented by a circle in FIG. 4H is illustrated in an enlarged view in FIG. 4I. In this case, the converter material 4 is arranged such that the contact drops 5 are omitted from the converter material 4. The converter material 4 thus has cutouts in the region of the contact drops 5.

In this case, the converter material is disposed completely downstream of the radiation exit area of the semiconductor chip such that a uniform radiation emission of the device can be obtained.

Figure 5A:
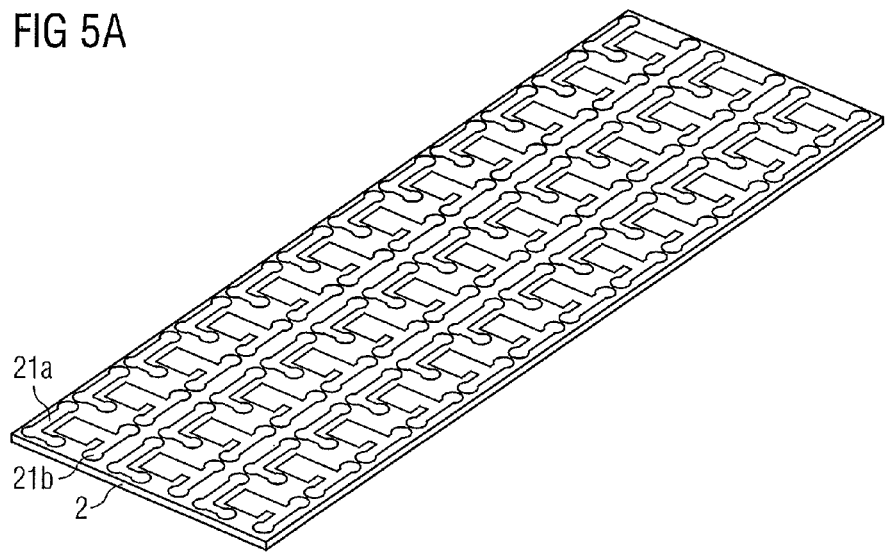
FIGS. 5A to 5D in each case show schematic views of a further example of our device in the production method.

FIGS. 5A to 5D illustrate method steps for producing a plurality of optoelectronic devices in a common method. Thus, as illustrated in FIG. 5A, a carrier substrate 2 is provided, which can be continuous. A plurality of first contact tracks 21a and second contact tracks 21b are arranged periodically on the carrier substrate 2. The contact tracks are preferably metal tracks applied by a plating process.

Figure 5B:
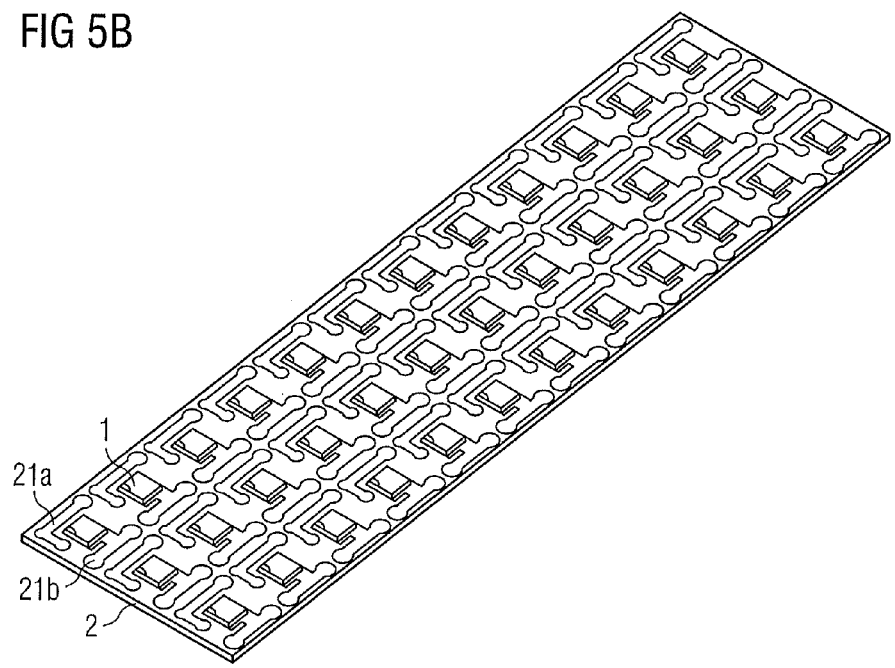

Subsequently, as illustrated in FIG. 5B, LEDs 1 of different sizes or types can be applied to this continuous carrier substrate 2, wherein the LEDs 1 are directly applied by an underside on the second contact track 21b of the carrier and are mechanically and electrically connected thereto.

Before the LEDs are applied to the carrier substrate 2, a reflective layer can optionally be applied to the top side of the carrier substrate 2. The reflective layer reflects the radiation emitted during operation in the direction towards the radiation exit side.

Subsequently, the film 3 is laminated onto the top side of the carrier substrate 2 and the LEDs 1, wherein the film 3 is likewise continuous such that the carrier substrate 2 can be completely covered with the film 3. The film has, on the top side, electrically conductive conductor tracks 31a, 31b suitable for the electrical contact-connection of the LEDs. Preferably, the conductor tracks are metallic tracks or metal alloys. In this case, the conductor tracks can be applied to the film before the film is laminated on the carrier substrate and the LEDs. Alternatively, the conductor track structure can be formed after the film has been applied on the carrier substrate and the LEDs.

By way of example, the conductor tracks are applied by a sputtering process with subsequent structuring. The conductor tracks and the film in the example in FIG. 5 are formed in the manner described in FIGS. 1 to 4, wherein the film with the conductor track structures is provided for a plurality of semiconductor chips. Converter material can subsequently be applied (not illustrated) on the radiation exit area of the semiconductor chips.

Figure 5C:
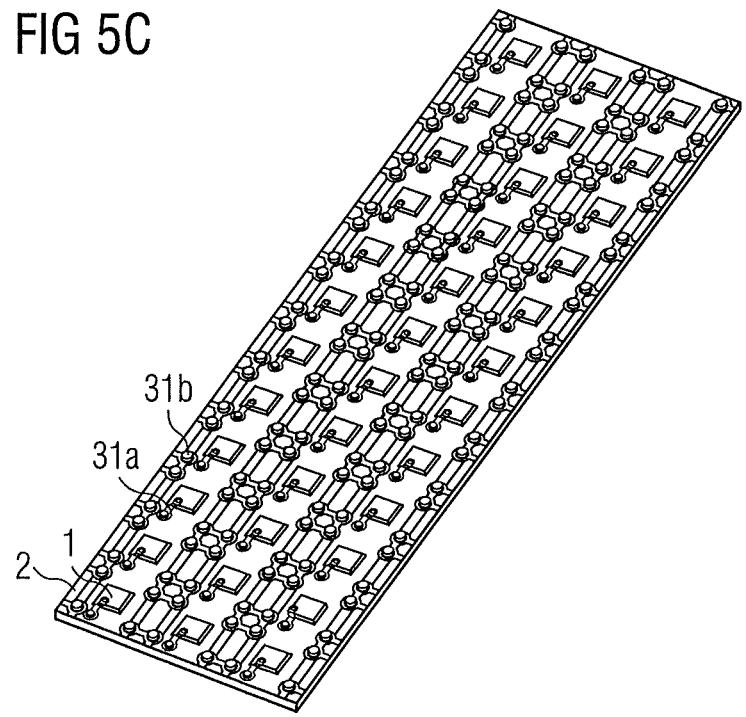

The plurality of devices are produced, as illustrated in FIG. 5C, in a continuous tape. In this case, the tape has a plurality of columns and rows into which the LEDs are arranged. The LEDs are therefore arranged in matrix-like fashion on the carrier substrate.

Figure 5D:
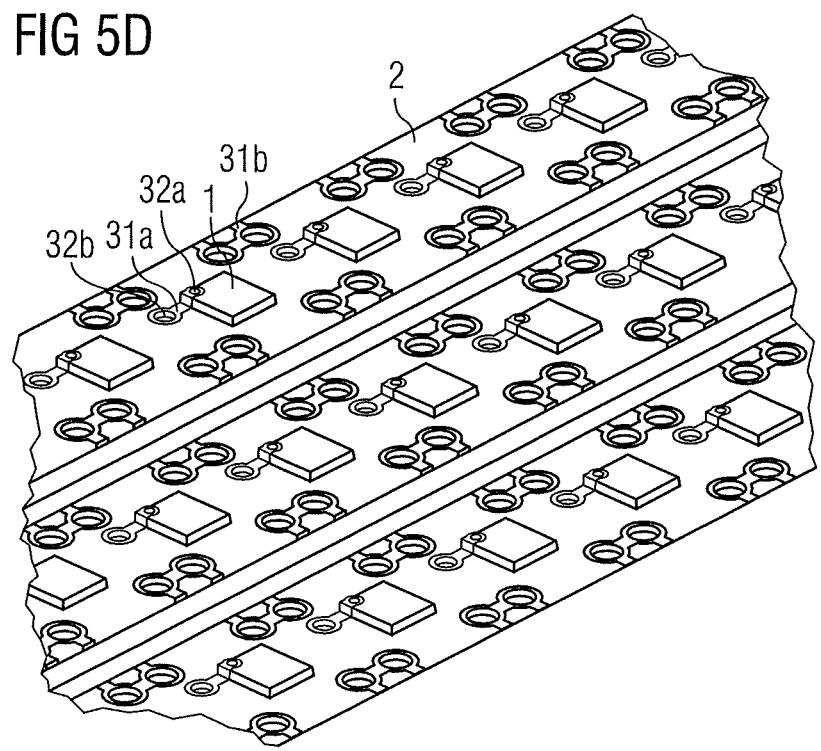

Alternatively, as illustrated in FIG. 5D, the tape can be individual strips on which a plurality of LEDs are applied laterally alongside one another.

Depending on the desired application, the devices can subsequently be singulated accordingly. Depending on the envisaged application, a finished produced device can in this case have a plurality of semiconductor chips or just one semiconductor chip.

The devices produced to completion as in FIG. 5 have substantially the features of the devices in the examples in FIGS. 1 to 4.

FIGS. 6A to 6E illustrate method steps for producing a plurality of further devices.

Figure 6A:
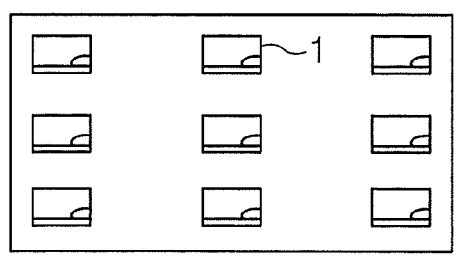
FIGS. 6A to 6E in each case show schematic views of a further example of our device in the production method.

FIG. 6A illustrates LED chips 1 which can be contact-connected on one side and which have, in particular, a contact area on the radiation exit side and a contact area on the side opposite the radiation exit side.

Figure 6B:
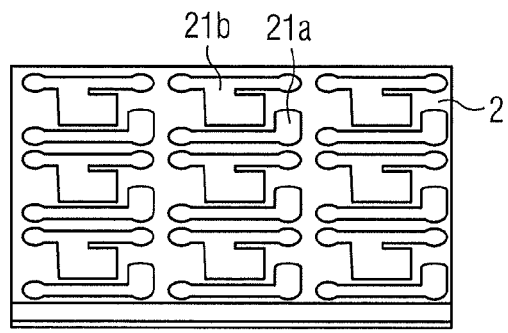

As illustrated in FIG. 6B, a carrier is provided, which has first contact tracks 21a and second contact tracks 21b. In this case, the contact tracks of the carrier are such that one of the contact tracks is suitable for the mechanical and electrical contact-connection of the semiconductor chip from the underside thereof. The individual contact tracks of the carrier are arranged, in particular, in a manner electrically insulated from one another by spacing.

Figure 6C:
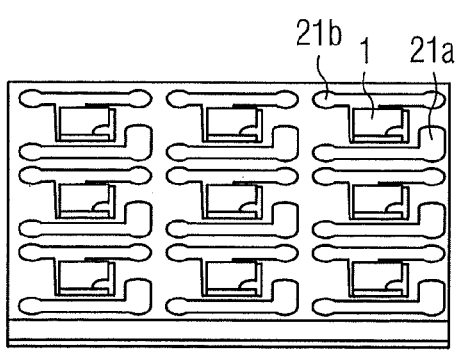
Figure 6D:
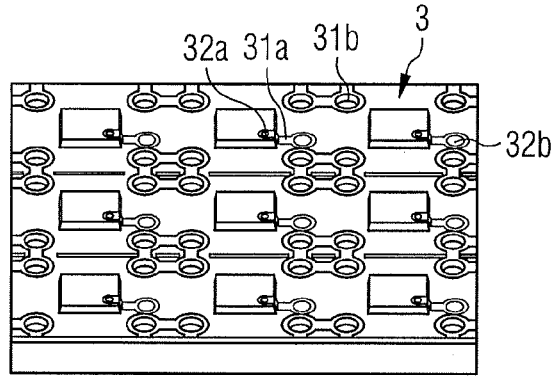

As illustrated in FIG. 6C, a respective LED chip 1 is applied on a second contact track 21b of the carrier substrate and electrically and mechanically connected thereto from the underside. Subsequently, a film 3 is laminated onto the plurality of LEDs and the carrier substrate, wherein the film 3 has a plurality of perforations 32a, 32b and a plurality of conductor tracks 31a, 31b. In particular, a first conductor track 31a and a second conductor track 31b are respectively provided for a respective LED chip 1. Each conductor track in turn has in each case two perforations 32a, 32b for the electrical contact-connection of the LED chip 1.

Figure 6E:
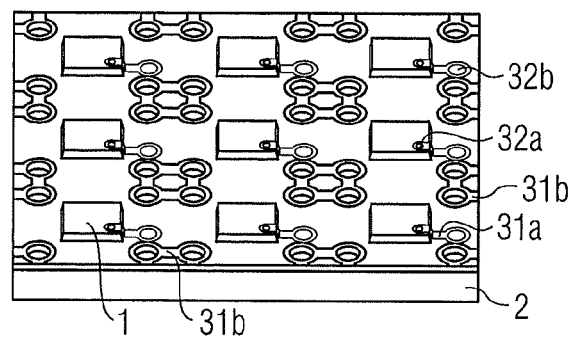

As illustrated in FIG. 6E, a converter layer, for example, a phosphor layer, can subsequently be applied to the top side of the film, the layer being suitable to at least partly convert the radiation emitted by the LED chips 1 into radiation having a different wavelength. Devices that emit white light can thus be realized.

The production methods described as in FIGS. 5 and 6 are suitable, in particular, to produce our devices for mass production.

For the rest, the example in FIG. 6 substantially corresponds to the example in FIG. 5.

Our devices and methods are not restricted to the examples by the description on the basis of these examples, but rather encompass any novel feature and also any combination of features, which in particular includes any combination of features in the appended claims, even if the feature or combination itself is not explicitly specified in the claims or examples.

The invention claimed is:

1. An optoelectronic semiconductor device comprising a semiconductor chip, a carrier substrate and a foil, wherein
    the semiconductor chip has an active layer that generates radiation,
    the carrier substrate has a first electrically conductive contact track and a second electrically conductive contact track on a top side,
    the semiconductor chip is arranged on the top side of the carrier substrate,
    the foil is arranged at least in regions on a radiation exit side of the semiconductor chip, said radiation exit side being remote from the carrier substrate and on the top side of the carrier substrate,
    the foil has at least one electrically conductive first conductor track at least in regions on a top side remote from the carrier substrate, and
    the foil has at least one first perforation and at least one second perforation arranged such that the semiconductor chip can be electrically contact-connected to the first contact track of the carrier substrate via the first conductor track of the foil,
    the carrier substrate has a cutout in which the semiconductor chip is arranged,
    the foil extends into the cutout when seen in a top view,
    a bottom and sidewalls of the cutout are free of the foil,
    an electrical contact-connection between the semiconductor chip and the first conductor track is in the form of contact drops located in a respective perforation of the foil,
    the contact drops project beyond a height of the perforations and completely fill the perforation, and
    a material of the contact drops differs from a material of the first conductor track.

2. The semiconductor device according to claim 1, wherein the film is fixed by an adhesive layer on the semiconductor chip and the carrier substrate.

3. The semiconductor device according to claim 2, wherein the adhesive layer has a thickness-5 μm to 10 μm.

4. The semiconductor device according to claim 1, wherein the perforations have a diameter of at least 100 μm.

5. The semiconductor device according to claim 1, wherein the perforations perforate the first conductor track at least in places and the perforations completely penetrate through the first conductor track.

6. The semiconductor device according to claim 1, wherein the film is a multilayer film having a plurality of electrically insulating film layers and further electrically conductive conductor tracks arranged therebetween.

7. The semiconductor device according to claim 1, wherein the diameter of the perforations decreases in a vertical direction from the top side of the film in a direction towards the carrier substrate.

8. The semiconductor device according to claim 5, wherein height of the cutout corresponds at least to height of the semiconductor chip.

9. The semiconductor device according to claim 1, wherein the film has a further perforation in the region of a radiation exit area of the semiconductor chip.

10. The semiconductor device according to claim 9, wherein a converter material is located in the further perforation.

11. An optoelectronic semiconductor device comprising a semiconductor chip, a carrier substrate and a film, wherein
    the semiconductor chip has an active layer that generates radiation,
    the carrier substrate has a first electrically conductive contact track and a second electrically conductive contact track on a top side,
    the semiconductor chip is arranged on the top side of the carrier substrate,
    the film is arranged at least in regions on a radiation exit side of the semiconductor chip, said radiation exit side being remote from the carrier substrate and on the top side of the carrier substrate, the film has at least one electrically conductive first conductor track at least in regions on a top side remote from the carrier substrate, the film has at least one first perforation and at least one second perforation arranged such that the semiconductor chip can be electrically contact-connected to the first contact track of the carrier substrate via the first conductor track of the film, the perforations perforate the first conductor track in places and the perforations completely penetrate through the first conductor track, an electrical contact-connection between the semiconductor chip and the first conductor track is in the form of contact drops located in a respective perforation of the film, a material of the contact drops differs from a material of the first conductor track, and the contact drops directly cover a part of a surface of the first conductor track remote from the semiconductor chip.

12. The semiconductor device according to claim 6, wherein height of the cutout corresponds at least to height of the semiconductor chip.

13. The semiconductor device according to claim 1, wherein height of the cutout corresponds at least to height of the semiconductor chip.

14. The optoelectronic semiconductor device according to claim 1, wherein a top face of the contact drops is concavely formed, and when viewed in a cross section, the top face is remote from the semiconductor chip.

\* \* \* \* \*

UNITED STATES PATENT AND TRADEMARK OFFICE
CERTIFICATE OF CORRECTION

| | |
|---|---|
| PATENT NO. | : 9,029,902 B2 |
| APPLICATION NO. | : 13/880768 |
| DATED | : May 12, 2015 |
| INVENTOR(S) | : Ahlstedt et al. |

It is certified that error appears in the above-identified patent and that said Letters Patent is hereby corrected as shown below:

In the claims,

<u>At Column 14</u>

At line 27, please change "the film" to -- the foil --; at line 39, please change "the film" to -- the foil --; and at line 44, please change "the film" to -- the foil --.

<u>At Column 15</u>

At line 25, please insert -- a -- before "height" at both occurrences.

Signed and Sealed this
Twentieth Day of October, 2015

Michelle K. Lee
*Director of the United States Patent and Trademark Office*